United States Patent
Lo et al.

(10) Patent No.: US 10,319,842 B2
(45) Date of Patent: *Jun. 11, 2019

(54) METHOD OF MANUFACTURING SEMICONDUCTOR DEVICE

(71) Applicant: TAIWAN SEMICONDUCTOR MANUFACTURING CO., LTD., Hsinchu (TW)

(72) Inventors: Wei-Yang Lo, Kaohsiung (TW); Shih-Hao Chen, Hsinchu County (TW); Mu-Tsang Lin, Changhua County (TW); Tung-Wen Cheng, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/934,793

(22) Filed: Mar. 23, 2018

(65) Prior Publication Data

US 2018/0212044 A1    Jul. 26, 2018

Related U.S. Application Data

(60) Continuation of application No. 15/381,032, filed on Dec. 15, 2016, now Pat. No. 9,929,254, which is a (Continued)

(51) Int. Cl.
*H01L 29/66* (2006.01)
*H01L 29/78* (2006.01)
(Continued)

(52) U.S. Cl.
CPC .... *H01L 29/66795* (2013.01); *H01L 21/3065* (2013.01); *H01L 21/30604* (2013.01); *H01L 29/0847* (2013.01); *H01L 29/6656* (2013.01); *H01L 29/785* (2013.01); *H01L 29/7854* (2013.01); *H01L 29/7848* (2013.01)

(58) Field of Classification Search
CPC .......... H01L 29/66795; H01L 29/6656; H01L 29/7854
See application file for complete search history.

(56) References Cited

U.S. PATENT DOCUMENTS 7,667,271 B2   2/2010   Yu et al.
8,703,556 B2   4/2014   Kelly et al.
(Continued)

FOREIGN PATENT DOCUMENTS

CN         103681347 A       3/2014
KR    10-2013-0106093 A      9/2013
(Continued)

*Primary Examiner* — Anthony Ho
(74) *Attorney, Agent, or Firm* — Maschoff Brennan

(57) ABSTRACT

A method for manufacturing a semiconductor device includes forming a gate stack over a semiconductor fin such that the gate stack exposes the semiconductor fin. The semiconductor fin exposed by the gate stack is recessed. An epitaxy structure is epitaxially grown on a recessed portion of the semiconductor fin, and the epitaxy structure is etched such that the epitaxy structure has a curved top.

20 Claims, 6 Drawing Sheets

Related U.S. Application Data division of application No. 14/742,552, filed on Jun. 17, 2015, now Pat. No. 9,559,207.

(60) Provisional application No. 62/136,949, filed on Mar. 23, 2015.

(51) Int. Cl.
*H01L 21/3065* (2006.01)
*H01L 21/306* (2006.01)
*H01L 29/08* (2006.01)

(56) References Cited

U.S. PATENT DOCUMENTS

| | | |
|---|---|---|
| 9,276,116 B2 | 3/2016 | Maeda et al. |
| 9,299,785 B2 | 3/2016 | Yu et al. |
| 9,929,254 B2 * | 3/2018 | Lo .................. H01L 29/6656 |
| 2005/0275010 A1 | 12/2005 | Chen et al. |
| 2008/0296702 A1 | 12/2008 | Lee et al. |
| 2012/0280250 A1 | 11/2012 | Basker et al. |
| 2014/0001520 A1 | 1/2014 | Glass et al. |
| 2014/0127872 A1 | 5/2014 | Oh et al. |
| 2014/0159159 A1 | 6/2014 | Steigerwald et al. |
| 2014/0203338 A1 | 7/2014 | Kelly et al. |
| 2014/0252489 A1 | 9/2014 | Yu et al. |

FOREIGN PATENT DOCUMENTS

| | | |
|---|---|---|
| KR | 10-2014-0097502 A | 8/2014 |
| KR | 10-2014-0111575 A | 9/2014 |
| TW | 200843109 A | 11/2008 |
| TW | 201409581 A | 3/2014 |
| TW | 201448120 A | 12/2014 |

\* cited by examiner

METHOD OF MANUFACTURING SEMICONDUCTOR DEVICE

PRIORITY CLAIM AND CROSS-REFERENCE

The present application is a continuation of U.S. patent application Ser. No. 15/381,032, filed Dec. 15, 2016, now U.S. Pat. No. 9,929,254, issued Mar. 27, 2018, which is a divisional application of U.S. patent application Ser. No. 14/742,552, filed Jun. 17, 2015, now U.S. Pat. No. 9,559,207, issued Jan. 31, 2017, which claims priority to U.S. Provisional Application Ser. No. 62/136,949, filed Mar. 23, 2015, which are herein incorporated by reference in their entireties.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FinFET is formed in this vertical fin. A gate is provided over (e.g., wrapping) the fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
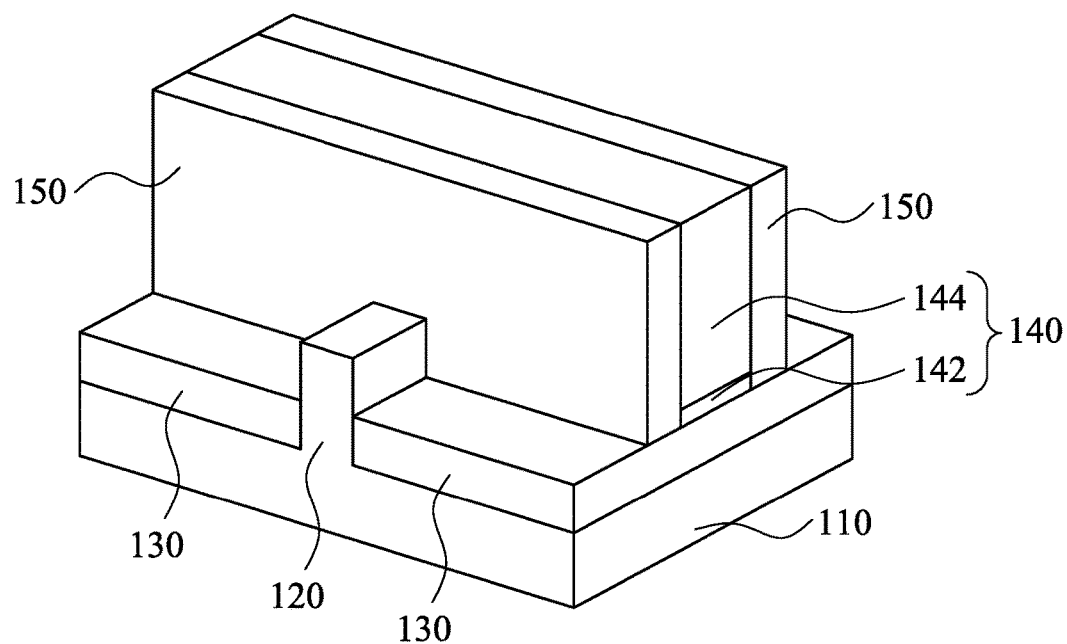
FIGS. 1 to 4 are perspective views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the present disclosure may be used with other configurations.

FIGS. 1 to 4 are perspective views of a method for manufacturing a semiconductor device at various stages in accordance with some embodiments of the present disclosure. Reference is made to FIG. 1. A substrate 110 is provided. In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

A semiconductor fin 120 is formed in the substrate 110, and a portion of the semiconductor fin 120 is protruded from the substrate 110. In some embodiments, the semiconductor fin 120 includes silicon. It is note that the number of the semiconductor fin 120 in FIG. 1 is illustrative, and should not limit the claimed scope of the present disclosure. A person having ordinary skill in the art may select suitable number for the semiconductor fin 120 according to actual situations.

The semiconductor fin 120 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fin 120 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In FIG. 1, a plurality of isolation structures 130 are formed on the substrate 110. The isolation structures 130, which act as a shallow trench isolation (STI) around the semiconductor fin 120, may be formed by chemical vapor deposition (CVD) techniques using tetra-ethyl-ortho-silicate (TEOS) and oxygen as a precursor. In some other embodiments, the isolation structures 130 may be formed by implanting ions, such as oxygen, nitrogen, carbon, or the like, into the substrate 110. In yet some other embodiments, the isolation structures 130 are insulator layers of a SOI wafer.

In FIG. 1, a gate stack 140 is formed on a portion of the semiconductor fin 120 and exposes another portion of the semiconductor fin 120. The gate stack 140 includes a gate insulator layer 142 and a gate electrode layer 144. The gate insulator layer 142 is disposed between the gate electrode layer 144 and the substrate 110, and is formed on the semiconductor fin 120. The gate insulator layer 142, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 142 may have a multilayer structure such as one layer of silicon oxide (e.g., interfacial layer) and another layer of high-k material. The gate insulator layer 142 may be formed using chemical vapor deposition (CVD), physical vapor deposition (PVD), atomic layer deposition (ALD), thermal oxide, ozone oxidation, other suitable processes, or combinations thereof.

The gate electrode layer 144 is formed over the substrate 110 to cover the gate insulator layer 142 and the portion of the semiconductor fin 120. In some embodiments, the gate electrode layer 144 includes a semiconductor material such as polysilicon, amorphous silicon, or the like. The gate electrode layer 144 may be deposited doped or undoped. For example, in some embodiments, the gate electrode layer 144 includes polysilicon deposited undoped by low-pressure chemical vapor deposition (LPCVD). Once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the gate electrode layer 144 may cinclude a polysilicon metal alloy or a metal gate including metals such as tungsten (W), nickel (Ni), aluminum (Al), tantalum (Ta), titanium (Ti), or any combination thereof.

In FIG. 1, a pair of dielectric layers 150 are formed over the substrate 110 and along the side of the gate stack 140. In some embodiments, the dielectric layers 150 may include silicon oxide, silicon nitride, silicon oxy-nitride, or other suitable material. The dielectric layers 150 may include a single layer or multilayer structure. A blanket layer of the dielectric layers 150 may be formed by CVD, PVD, ALD, or other suitable technique. Then, an anisotropic etching is performed on the blanket layer to form a pair of the dielectric layer 150 on two sides of the gate stack 140. In some embodiments, the dielectric layers 150 are used to offset subsequently formed doped regions, such as source/drain regions. The dielectric layers 150 may further be used for designing or modifying the source/drain region (junction) profile.

Figure 2:
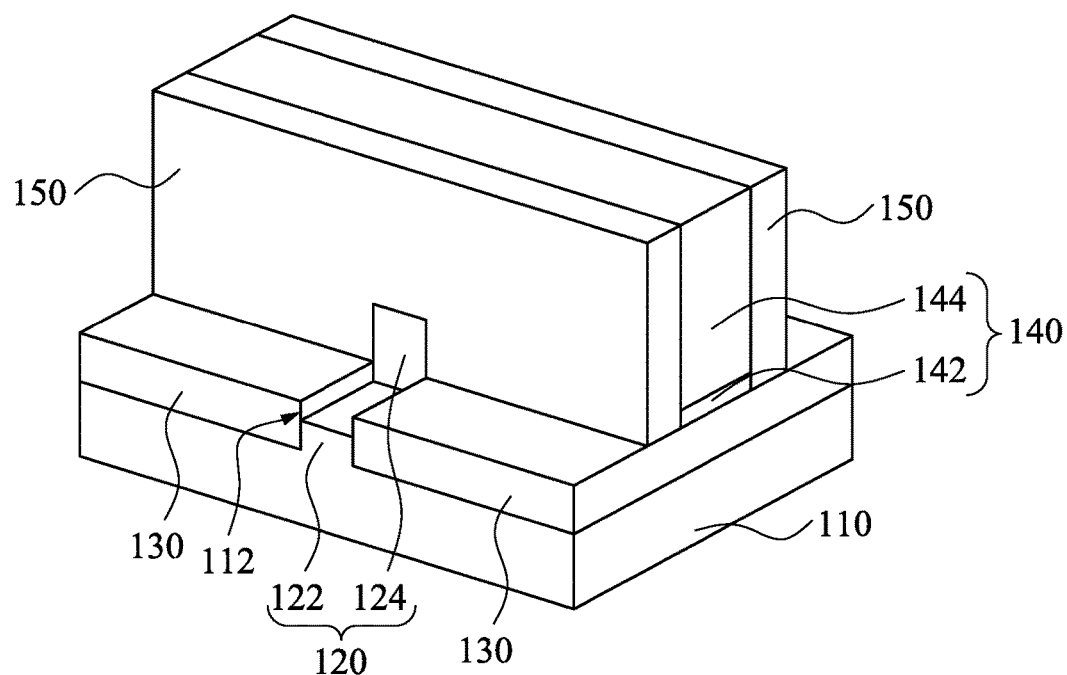

Reference is made to FIG. 2. A portion of the semiconductor fin 120 exposed both by the gate stack 140 and the dielectric layers 150 is partially removed (or partially recessed) to form a recess 112 in the substrate 110. Any suitable amount of material may be removed. The remaining semiconductor fin 120 has an embedded portion 122 and a protruding portion 124. The embedded portion 122 is embedded in the substrate 110 and a portion thereof is exposed by the recess 112. The protruding portion 124 is disposed on the embedded portion 122 and is protruded from the substrate 110. The gate stack 140 and the dielectric layers 150 covers the protruding portion 144, but the sidewall of the protruding portion 144 is exposed by the dielectric layer 150.

Removing a portion of the semiconductor fin 120 may include forming a photoresist layer or a capping layer (such as an oxide capping layer) over the structure of FIG. 1, patterning the photoresist or capping layer to have openings that expose a portion of the semiconductor fin 120, and etching back material from the semiconductor fin 120. In some embodiments, the semiconductor fin 120 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recess 112 with HF or other suitable solution.

Figure 3:
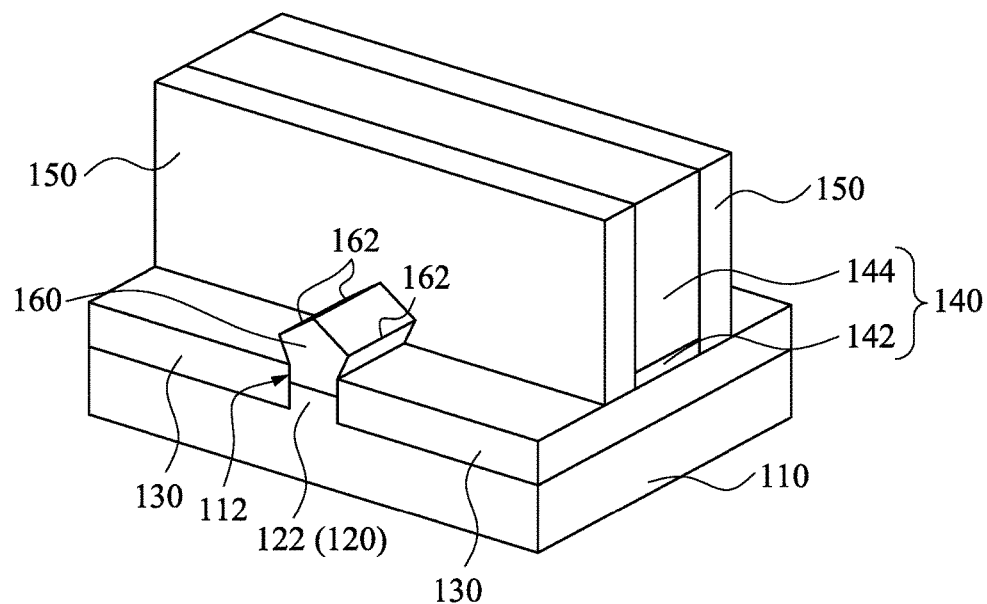

Reference is made to FIG. 3. Subsequently, an unshaped epitaxy structure 160 is formed in the recess 112 and on the embedded portion 122 of the semiconductor fin 120. The unshaped epitaxy structure 160 is protruded from the substrate 110. The unshaped epitaxy structure 160 may be formed using one or more epitaxy or epitaxial (epi) processes, such that Si features, SiGe features, and/or other suitable features can be formed in a crystalline state on the embedded portion 122 of the semiconductor fin 120. In some embodiments, a lattice constant of the unshaped epitaxy structure 160 is different from a lattice constant of the semiconductor fin 120, and the unshaped epitaxy structure 160 is strained or stressed to enable carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the embedded portion 122 of the semiconductor fin 120 (e.g., silicon). Thus, a strained channel can be achieved to increase carrier mobility and enhance device performance. The unshaped epitaxy structure 160 may be in-situ doped. The doping species include p-type dopants, such as boron or $BF_2$; n-type dopants, such as phosphorus or arsenic; and/or other suitable dopants including combinations thereof. If the unshaped epitaxy structure 160 is not in-situ doped, a second implantation process (i.e., a junction implant process) is performed to dope the unshaped epitaxy structure 160. One or more annealing processes may be performed to activate the unshaped epitaxy structure 160. The annealing processes include rapid thermal annealing (RTA) and/or laser annealing processes.

The unshaped epitaxy structure 160 has at least one corner 162. For example, in FIG. 3, there are three corners 162. The corners 162 may form fringe electric field when a bias is applied thereto, and a parasitic capacitance may be formed between the unshaped epitaxy structure 160 and the gate stack 140. The parasitic capacitance will lower the cutoff frequency of the semiconductor device, and will limit the overall alternating current (AC) performance.

Figure 4:
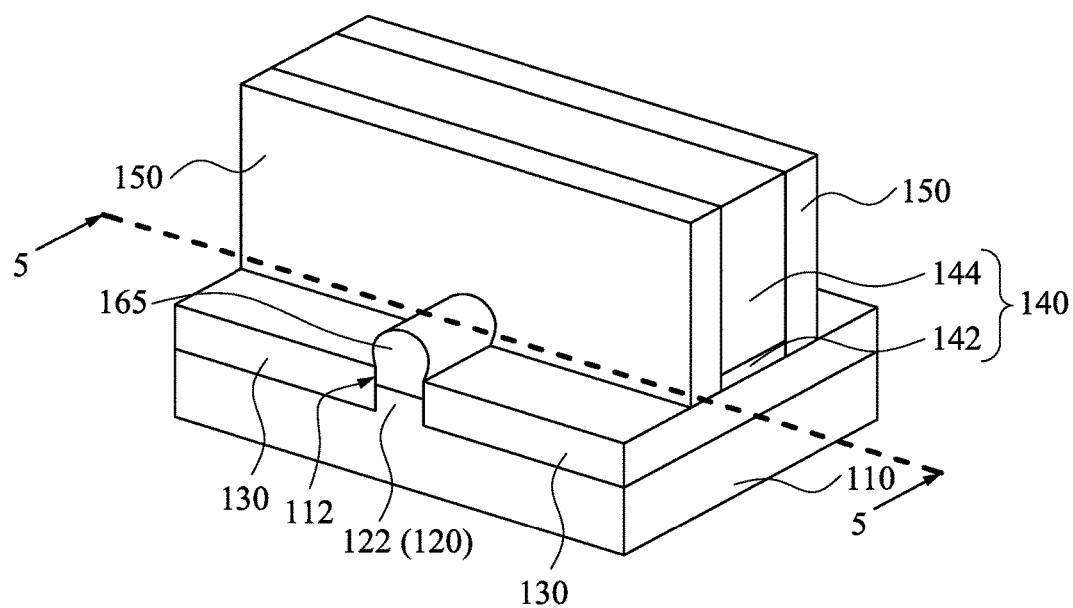
Figure 5:
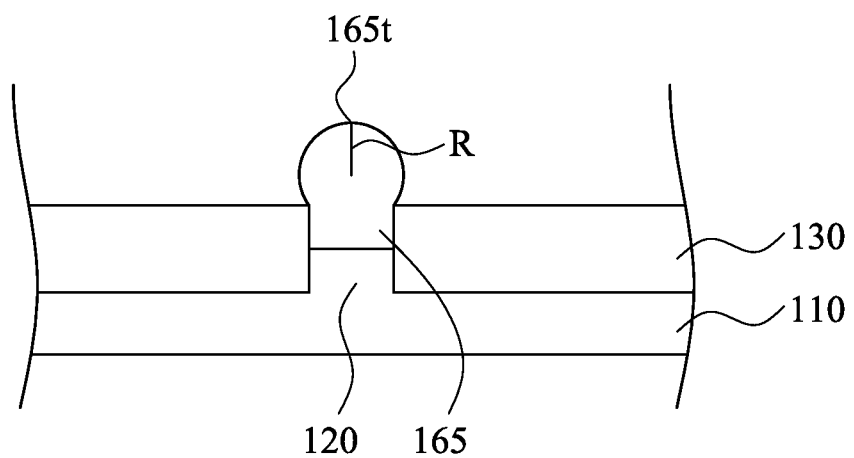
FIG. 5 is a cross-sectional view taking along line 5-5 of FIG. 4.

Reference is made to FIGS. 4 and 5, wherein FIG. 5 is a cross-sectional view taking along line 5-5 of FIG. 4. A shape modifying process is performed to the unshaped epitaxy structure 160 of FIG. 3. For example, the unshaped epitaxy structure 160 of FIG. 3 can be etched to form an epitaxy structure 165 with a smooth top surface 165t. In other words, the corners 162 of the unshaped epitaxy structure 160 are partially removed to smooth the top surface of the unshaped epitaxy structure 160. The top surface 165t is a surface facing away the substrate 110. In some embodiments, the etching process may be performed using a wet etching process, for example, by dipping the unshaped epitaxy structure 160 in hydrofluoric acid (HF). In some other embodiments, the etching step may be performed using a non-biased dry etching process, for example, the dry etching process may be performed using $CHF_3$ or $BF_3$ as etching gases. The epitaxy structure 165 is therefore referred as a source/drain region of the semiconductor device.

In FIG. 5, the epitaxy structure 165 has the top surface 165t facing away the substrate 110, and the top surface 165t has at least one curved portion C having a radius of curvature R ranging from about 5 nm to about 20 nm. The shape modifying process of FIG. 4 can remove the corners 162 of the unshaped epitaxy structure 160 (see FIG. 3), and the top surface 165t becomes a smooth (or round) surface. Without the corners 162, the fringe electric field is not easy to be formed around the top surface 165t of the epitaxy structure 165, and the parasitic capacitance problem of the semiconductor device can be improved.

Figure 6:
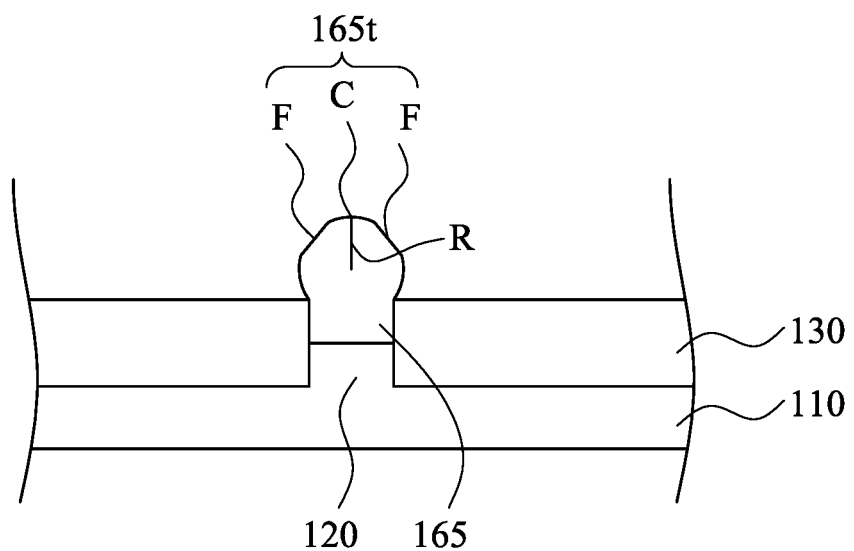
FIG. 6 is a cross-sectional view of a semiconductor device in accordance with some embodiments of the present disclosure.

FIG. 6 is a cross-sectional view of a semiconductor device in accordance with some embodiments of the present disclosure. The difference between the semiconductor devices of FIGS. 6 and 5 pertains to the shape of the top surface 165t of the epitaxy structure 165. In FIG. 6, the top surface 165t has a curved portion C and two flat portions F. The curved portion C is disposed between the flat portions F. The curved portion C has a radius of curvature R ranging from about 5 nm to about 20 nm while a radius of curvature of the flat portions F is substantially infinity. In FIG. 6, since the epitaxy structure 165 doesn't have sharp corners, the parasitic capacitance problem of the semiconductor device can be improved. It is noted that the drawing of the top surface 165t in FIGS. 5 and 6 are illustrative, and should not limit the claimed scope of the present disclosure. Basically, embodiments fall within the claimed scope of the present disclosure if the top surface 165t has at least one curved portion C having a radius of curvature R ranging from about 5 nm to about 20 nm. Other features of the semiconductor device are similar to those of the semiconductor device shown in FIG. 5, and therefore, a description in this regard will not be provided hereinafter.

Figure 7:
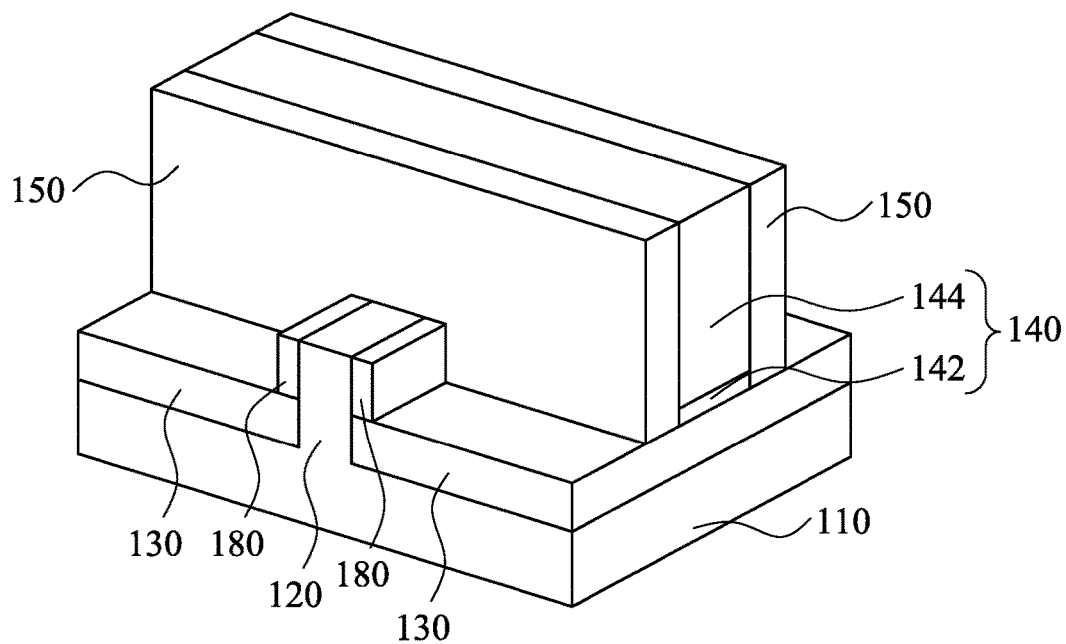
FIGS. 7 to 9 are perspective views of a method for manufacturing a semiconductor device at various stages in accordance with some embodiments of the present disclosure.
Figure 8:
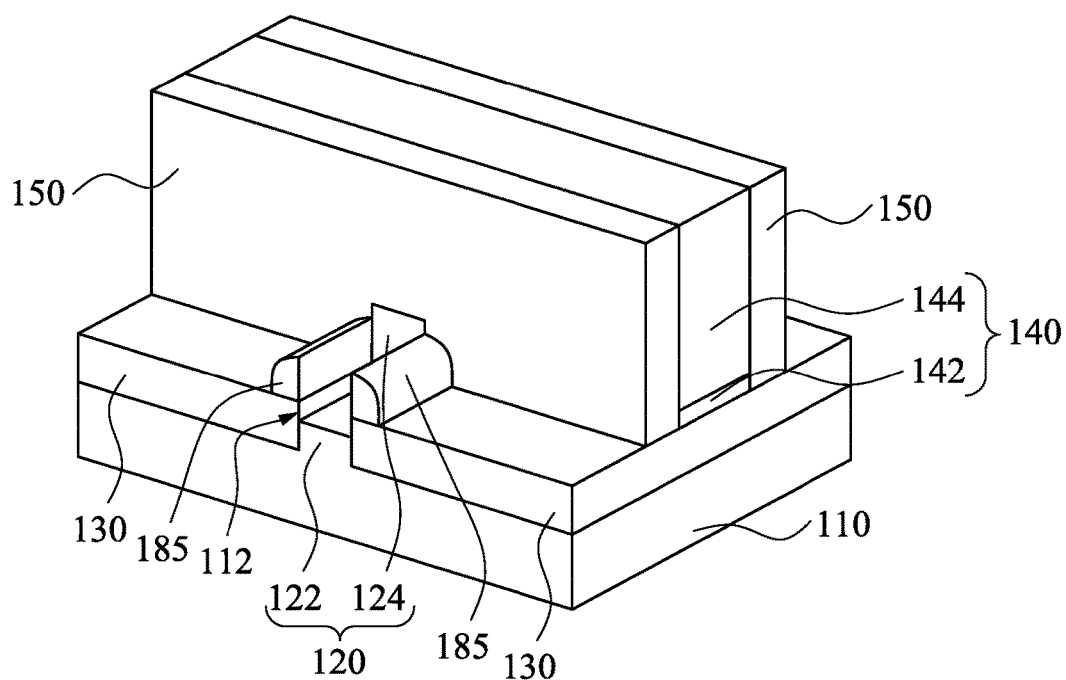
Figure 9:
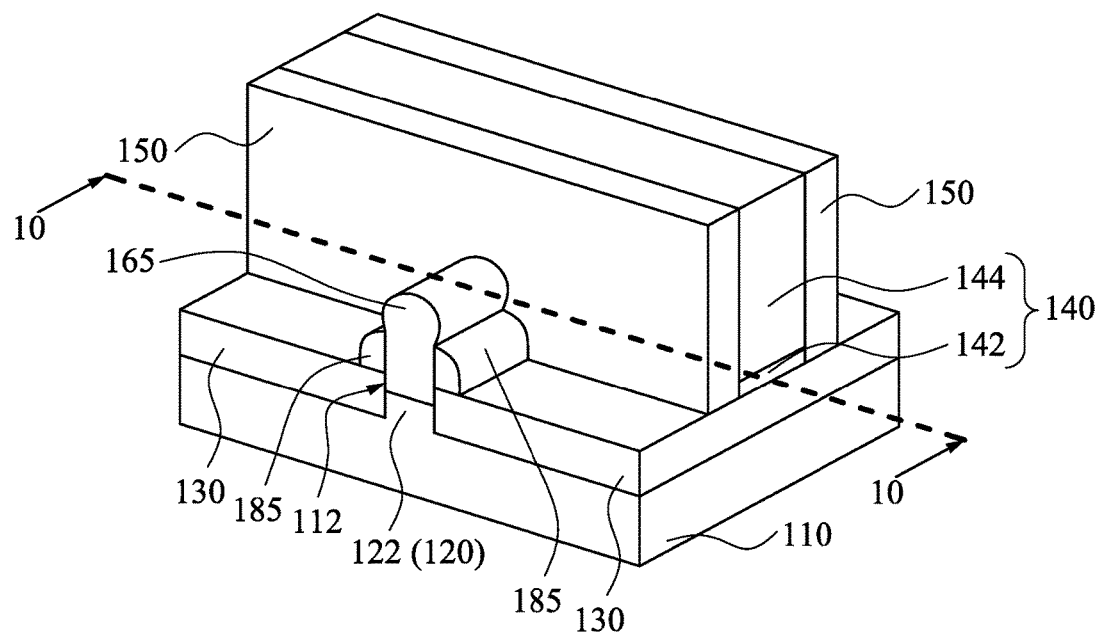

FIGS. 7 to 9 are perspective views of a method for manufacturing a semiconductor device at various stages in accordance with some embodiments of the present disclosure. The manufacturing processes of FIG. 1 are performed in advance. Since the relevant manufacturing details are similar to the abovementioned embodiment, and, therefore, a description in this regard will not be repeated hereinafter. Reference is made to FIG. 7. Subsequently, a shape modifying process is performed. In greater details, a pair of unshaped sidewall structures 180 are formed at opposite sides of the portion of the semiconductor fin 120 protruded from the substrate 110 and exposed by the gate stack 140 and the dielectric layers 150. In some embodiments, the unshaped sidewall structures 180 can include single or multiple layers, and can be made of nitride oxy-nitride, or combination thereof.

Reference is made to FIG. 8. The portion of the semiconductor fin 120 exposed both by the gate stack 140 and the dielectric layers 150 is partially removed (or partially recessed) to form a recess 112 in the substrate 110. Any suitable amount of material may be removed. The remaining semiconductor fin 120 has an embedded portion 122 and a protruding portion 124. The embedded portion 122 is embedded in the substrate 110 and a portion thereof is exposed by the recess 112. The protruding portion 124 is disposed on the embedded portion 122 and is protruded from the substrate 110. The gate stack 140 and the dielectric layers 150 covers the protruding portion 144, but the sidewall of the protruding portion 144 is exposed by the dielectric layer 150.

Meanwhile, the removing process is also performed to shape the unshaped sidewall structures 180. The unshaped sidewall structures 180 are shaped to be the sidewall structure 185. In some embodiments, the unshaped sidewall structures 180 are isotropically shaped. In some other embodiments, the unshaped sidewall structures 180 are anisotropically (or directionally) shaped, or combination thereof.

Removing a portion of the semiconductor fin 120 may include forming a photoresist layer or a capping layer (such as an oxide capping layer) over the structure of FIG. 7, patterning the photoresist or capping layer to have openings that expose a portion of the semiconductor fin 120 and the unshaped sidewall structures 180, and etching back material from the semiconductor fin 120. In some embodiments, the semiconductor fin 120 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recess 112 with HF or other suitable solution.

Figure 10:
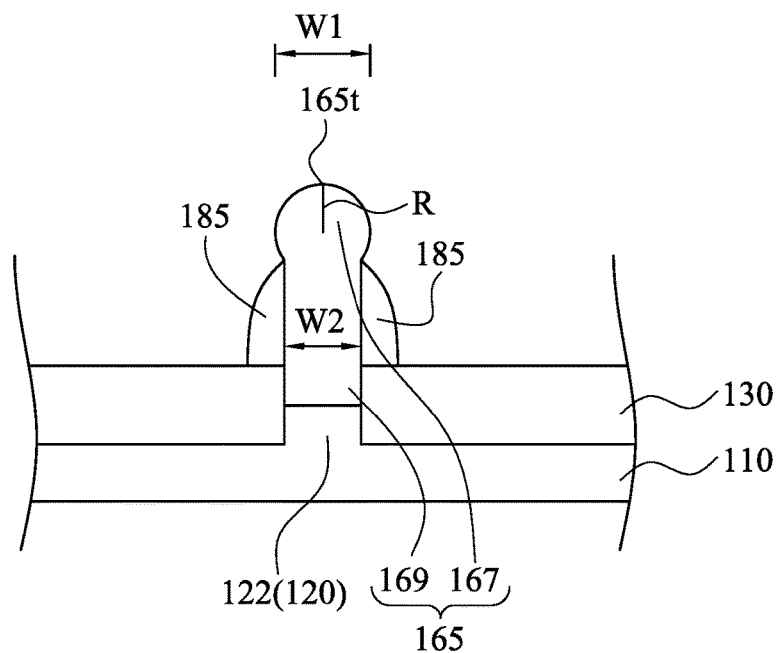
FIG. 10 is a cross-sectional view taking along line 10-10 of FIG. 9.

Reference is made to FIGS. 9 and 10, wherein FIG. 10 is a cross-sectional view taking along line 10-10 of FIG. 9. Subsequently, an epitaxy structure 165 is formed in the recess 112 and on the embedded portion 122 of the semiconductor fin 120. The epitaxy structure 165 is protruded from the substrate 110. The epitaxy structure 165 is referred as a source/drain region of the semiconductor device. The epitaxy structure 165 may be formed using one or more epitaxy or epitaxial (epi) processes, such that Si features, SiGe features, and/or other suitable features can be formed in a crystalline state on the embedded portion 122 of the semiconductor fin 120. In some embodiments, a lattice constant of the epitaxy structure 165 is different from a lattice constant of the semiconductor fin 120, and the epitaxy structure 165 is strained or stressed to enable carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the embedded portion 122 of the semiconductor fin 120 (e.g., silicon). Thus, a strained channel can be achieved to increase carrier mobility and enhance device performance. The epitaxy structure 165 may be in-situ doped. The doping species include p-type dopants, such as boron or $BF_2$; n-type dopants, such as phosphorus or arsenic; and/or other suitable dopants including combinations thereof. If the epitaxy structure 165 is not in-situ doped, a second implantation process (i.e., a junction implant process) is performed to dope the epitaxy structure 165. One or more annealing processes may be performed to activate the epitaxy structure 165. The annealing processes include rapid thermal annealing (RTA) and/or laser annealing processes.

In FIG. 9, the sidewall structures 185 can shape the profile of the epitaxy structure 165. Through modifying the shape of the sidewall structures 185 during the etching process of FIG. 8 (for example, by modifying the reactive ions thereof), the regrowth of the epitaxy structure 165 can be constrained, and a smooth top surface 165t can be formed to improve the parasitic capacitance problem thereof.

In FIG. 9, the epitaxy structure 165 has a top portion 167 and a body portion 169. The body portion 169 is disposed between the top portion 167 and the substrate 110. In other words, the body portion 169 is disposed between the top portion 167 and the embedded portion 122 of the semiconductor fin 120. The top portion 167 has a width W1 greater than a width W2 of the body portion 169, and the top portion 167 has the top surface 165t. The sidewall structures 185 are disposed at opposite sides of the body portion 169 of the epitaxy structure 165 to shape the profile of the epitaxy structure 165 when the epitaxy structure 165 is regrown. The sidewall structures 185 expose the top surface 165t of the epitaxy structure 165, and the top portion 167 is cylinder shaped. That is, in FIGS. 9 and 10, the sidewall structures 185 do not have sharp corners. Therefore, the parasitic capacitance problem of the semiconductor device can be improved.

Figure 11:
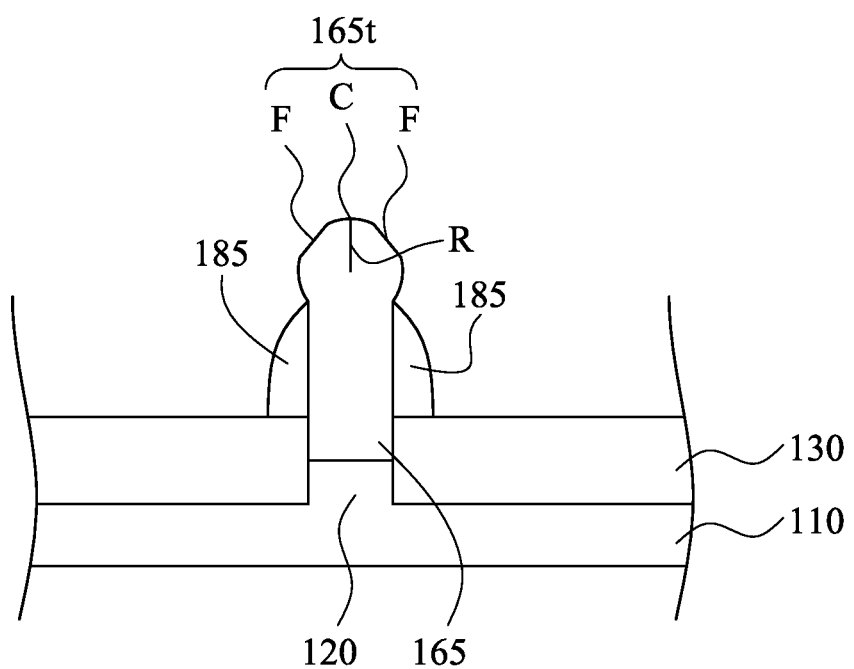
FIG. 11 is a cross-sectional view of a semiconductor device in accordance with some embodiments of the present disclosure.

FIG. 11 is a cross-sectional view of a semiconductor device in accordance with some embodiments of the present disclosure. The difference between the semiconductor devices of FIGS. 11 and 10 pertains to the shape of the top surface 165t of the epitaxy structure 165. In FIG. 11, the top surface 165t has a curved portion C and two flat portions F. The curved portion C is disposed between the flat portions F. The curved portion C has a radius of curvature R ranging from about 5 nm to about 20 nm while a radius of curvature of the flat portions F is substantially infinity. In FIG. 11, since the epitaxy structure 165 doesn't have sharp corners, the parasitic capacitance problem of the semiconductor device can be improved. It is noted that the drawing of the top surface 165t in FIGS. 10 and 11 are illustrative, and should not limit the claimed scope of the present disclosure. Basically, embodiments fall within the claimed scope of the present disclosure if the top surface 165t has at least one curved portion C having a radius of curvature R ranging from about 5 nm to about 20 nm. Other features of the semiconductor device are similar to those of the semiconductor device shown in FIG. 10, and therefore, a description in this regard will not be provided hereinafter.

According to the abovementioned embodiments, the epitaxy structure has the top surface facing away the substrate, and the top surface has at least one curved portion having a radius of curvature ranging from about 5 nm to about 20 nm. The shape modifying process can remove the corners of the unshaped epitaxy structure, or can make the smooth epitaxy structure in the regrowing process. Without the sharp corners, fringe electric field is not easy to be form around the top surface of the epitaxy structure, and the parasitic capacitance problem of the semiconductor device can be improved.

According to some embodiments of the present disclosure, a method for manufacturing a semiconductor device includes forming a gate stack over a semiconductor fin such that the gate stack exposes the semiconductor fin, recessing the semiconductor fin exposed by the gate stack, epitaxially growing an epitaxy structure on a recessed portion of the semiconductor fin, and etching the epitaxy structure such that the epitaxy structure has a curved top.

According to some embodiments of the present disclosure, a method for manufacturing a semiconductor device includes forming a pair of sidewall structures at opposite sides of a semiconductor fin, shaping the sidewall structures, recessing the semiconductor fin to expose the sidewall structures, and epitaxially growing an epitaxy structure on a recessed portion of the semiconductor fin. The epitaxy structure has a body portion between the shaped sidewall structures and a top portion over the body portion, and a width of the top portion is greater than a width of the body portion.

According to some embodiments of the present disclosure, a method for manufacturing a semiconductor device includes forming a gate stack over a semiconductor fin to expose the semiconductor fin, recessing the semiconductor fin exposed by the gate stack, epitaxially growing an epitaxy structure on a recessed portion of the semiconductor fin, and rounding a top portion of the epitaxy structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:

forming a gate stack over a semiconductor fin such that a portion of the semiconductor fin is uncovered by the gate stack;

recessing the portion of the semiconductor fin;

epitaxially growing an epitaxy structure on a recessed portion of the semiconductor fin; and etching the epitaxy structure, wherein the etched epitaxy structure has a curved top.

2. The method of claim 1, further comprising forming a pair of isolation structures, wherein recessing the semiconductor fin exposes sidewalls of the isolation structures.

3. The method of claim 2, wherein the epitaxy structure is between and in contact with the sidewalls of the isolation structures.

4. The method of claim 1, wherein the etching the epitaxy structure comprises smoothing a sidewall of the epitaxy structure.

5. The method of claim 1, wherein after the etching the epitaxy structure, a flat portion of the etched epitaxy structure is adjacent the curved top of the etched epitaxy structure.

6. The method of claim 1, wherein after the etching the epitaxy structure, the curved top of the etched epitaxy structure is between a pair of flat portions of the etched epitaxy structure.

7. A method for manufacturing a semiconductor device, the method comprising:

forming a pair of sidewall structures at opposite sides of a semiconductor fin;

shaping the sidewall structures;

recessing the semiconductor fin to expose the shaped sidewall structures; and epitaxially growing an epitaxy structure on a recessed portion of the semiconductor fin such that the epitaxy structure has a body portion between the shaped sidewall structures and a top portion over the body portion, and a width of the top portion is greater than a width of the body portion.

8. The method of claim 7, wherein the top portion of the epitaxy structure has a curved top.

9. The method of claim 7, wherein the shaping the sidewall structures is performed when recessing the semiconductor fin.

10. The method of claim 7, wherein the shaping the sidewall structures comprises etching the sidewall structures.

11. A method for manufacturing a semiconductor device, the method comprising:

forming a gate stack over a semiconductor fin, wherein a portion of the semiconductor fin is uncovered by the gate stack;

recessing the portion of the semiconductor fin;

epitaxially growing an epitaxy structure on a recessed portion of the semiconductor fin; and rounding a top portion of the epitaxy structure.

12. The method of claim 11, wherein the rounding the top portion of the epitaxy structure comprises etching the epitaxy structure.

13. The method of claim 11, wherein the rounding the top portion of the epitaxy structure comprises removing a corner of the epitaxy structure.

14. The method of claim 11, further comprising forming a pair of sidewall structures at opposite sides of the portion of the semiconductor fin, wherein rounding the top portion of the epitaxy structure comprises shaping the sidewall structures.

15. The method of claim 14, wherein after the shaping the sidewall structures, upper portions of the sidewall structures have a lesser width than lower portions of the sidewall structures.

16. The method of claim 11, further comprising forming a pair of sidewall structures at opposite sides of the portion of the semiconductor fin, and rounding a sidewall of the epitaxy structure by shaping the sidewall structures.

17. The method of claim 11, wherein after the rounding the top portion of the epitaxy structure, a flat portion of the epitaxy structure is adjacent the rounded top portion of the epitaxy structure.

18. The method of claim 11, wherein after the rounding the top portion of the epitaxy structure, the rounded top portion of the epitaxy structure is between a pair of flat portions of the epitaxy structure.

19. The method of claim 11, further comprising rounding a sidewall of the epitaxy structure by removing a corner of the epitaxy structure.

20. The method of claim 11, further comprising shaping a sidewall structure, wherein after the shaping a sidewall structure, an upper portion of the sidewall structure has a lesser width than a lower portion of the sidewall structure, and a body portion of the epitaxy structure is in contact with the sidewall structure.

* * * * *